United States Patent [19]

Okumura

[11] Patent Number: 5,212,542
[45] Date of Patent: May 18, 1993

[54] SEMICONDUCTOR DEVICE HAVING AT LEAST TWO FIELD EFFECT TRANSISTORS AND METHOD OF MANUFACTURING THE SAME

[75] Inventor: Yoshinori Okumura, Hyogo, Japan

[73] Assignee: Mitsubishi Denki Kabushiki Kaisha, Tokyo, Japan

[21] Appl. No.: 675,247

[22] Filed: Mar. 26, 1991

[30] Foreign Application Priority Data

May 30, 1990 [JP] Japan .................. 2-142194

[51] Int. Cl.⁵ .................. H01L 27/02; H01L 21/265
[52] U.S. Cl. .................. 257/369; 437/29; 437/34; 437/35; 437/41; 257/328; 257/346
[58] Field of Search .................. 357/23.9, 42, 23.4; 437/29, 34, 35, 41

[56] References Cited

U.S. PATENT DOCUMENTS

| | | | |
|---|---|---|---|
| 4,577,391 | 3/1986 | Hsia et al. | 357/23.9 |
| 4,760,033 | 7/1988 | Mueller | 437/34 |
| 4,876,213 | 10/1989 | Pfiester | 357/42 |
| 4,937,645 | 6/1990 | Ootsuka et al. | 357/42 |

FOREIGN PATENT DOCUMENTS

| | | |
|---|---|---|
| 0164449 | 12/1984 | European Pat. Off. |
| 0244607 | 3/1987 | European Pat. Off. |
| 63-226055 | 9/1988 | Japan |

OTHER PUBLICATIONS

Chen et al–IEEE Transactions on Electron Devices, vol. 35, No. 12 Dec. 1988, pp. 2210–2218.
Vyas et al–IEEE Transactions on Electron Devices, vol. ED-32, No. 5, May, 1985, pp. 926–930.
Pfiester et al.–IEEE Transactions on Electron Devices, vol. 36, No. 11, Nov. 1989, pp. 2422–2432.
Tsang, et al., "Fabrication of High–Performance LDDFET's with Oxide Sidewall–Spacer Technology", IEEE Transactions of Electron Devices, vol. ED-29, No. 4 (Apr. 1982), pp. 590–596.
Inuishi et al, 1988 Symposium on VLSI Technology, Digest of Technical Papers, pp. 33–34 (May 22, 1988, Kyoto, Japan).

Primary Examiner—Edward J. Wojciechowicz
Attorney, Agent, or Firm—Lowe, Price, LeBlanc & Becker

[57] ABSTRACT

A complementary field effect transistor with an N channel MOSFET and a P channel MOSFET formed on the same substrate is disclosed. On the P type main surface of the semiconductor substrate, an N channel MOSFET is formed comprising a gate electrode and a pair of impurity regions which becomes a pair of source/drain regions. Each impurity region of the N channel MOSFET comprises an impurity region of relatively low concentration formed so as to extend to beneath the above mentioned gate electrode, and an impurity region having a concentration higher than that of said impurity region having low concentration formed in a position at a distance from said gate electrode joining the impurity region of low concentration. The length of the portion located beneath the above mentioned gate electrode in the surface portion of the impurity region of low concentration is not less than 0.1 μm in the direction identical to the direction of the channel length. This complementary field effect transistor has both reliability and high speed in the N channel MOSFET, and without punch-through in the P channel MOSFET, even though the devices become more minute.

9 Claims, 7 Drawing Sheets

EDGE OF GATE

EDGE OF GATE

EDGE OF GATE

SEMICONDUCTOR DEVICE HAVING AT LEAST TWO FIELD EFFECT TRANSISTORS AND METHOD OF MANUFACTURING THE SAME

BACKGROUND OF THE INVENTION

1. Field of the Invention

The invention relates generally to semiconductor device having at least two field effect transistors, and more particularly, to a complementary field effect transistor improved so as to have both reliability and high speed in an N channel MOSFET and without punch-through in a P channel MOSFET. This invention relates to a method of manufacturing such a complementary field effect transistor.

2. Description of the Background Art

Figure 4A:
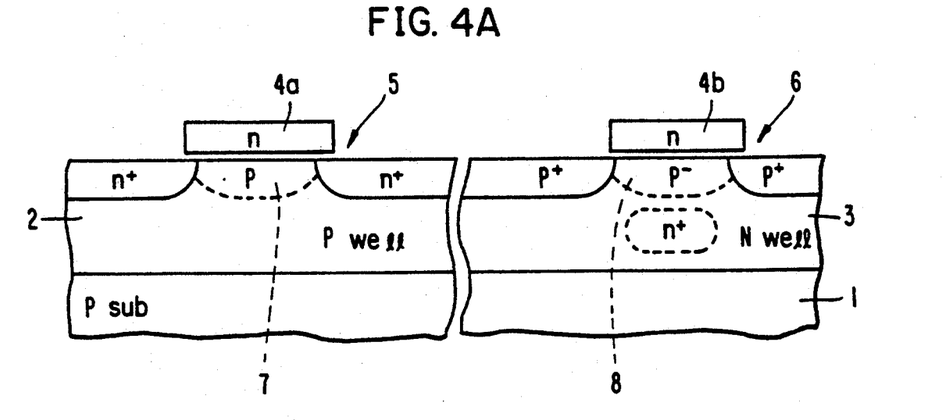
FIG. 4A is a partial sectional view of a conventional complementary field effect transistor.
Figure 4B:
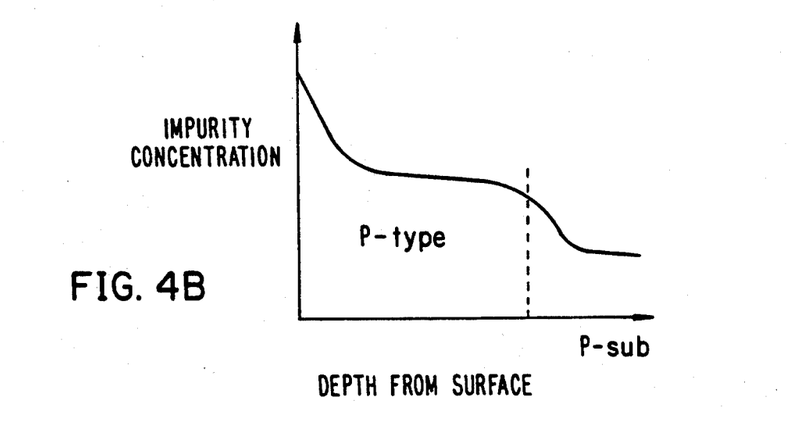
FIG. 4B is a channel profile of the N channel MOSFET of FIG. 4A.

At present, complementary field effect transistors (referred to as CMOSFET hereinafter) are employed in very large scale LSIs, for example in dynamic random access memories, because of its characteristics of low power consumption and easy circuit design. The N channel MOSFET and the P channel MOSFET used in CMOS circuits have surface channel structures and buried channel structures, respectively, as the result of being formed by simplified manufacturing processing, as shown in FIGS. 4A and 4B.

Figure 4C:
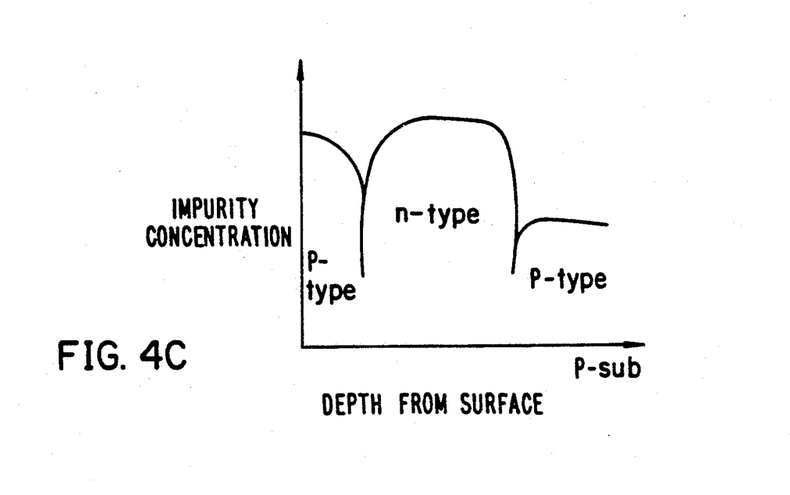
FIG. 4C is a channel profile of the P channel MOSFET of FIG. 4A.

Surface channel structures and buried channel structures will be explained in detail in reference to the figures. FIG. 4A is a sectional view of a conventional CMOSFET. FIG. 4B is a channel profile of a NMOS, whereas FIG. 4C is a channel profile of a PMOS. Referring to these figures, a P well 2 and an N well 3 are formed on a P type semiconductor substrate 1. An N channel MOSFET 5 is formed in P well 2, while a P channel MOSFET 6 is formed in N well 3. Each of the gate electrodes 4a, 4b is made the N type. Because gate electrodes 4a, 4b are of the N type, the channel region 7 of N channel MOSFET 5 becomes P type, and N channel MOSFET 5 is of the surface channel structure. On the other hand, the channel region 8 of P channel MOSFET 6 becomes P type, and P channel MOSFET 6 is of the buried channel structure.

As the device becomes more minute, the gate length of N channel MOSFET 5 and P channel MOSFET 6 becomes shorter. This gives rise to the problem that reliability is deteriorated due to hot carriers of N channel MOSFET 5. In other words, if the channel length becomes shorter, the electric field near the drain becomes very high under a constant supply voltage. This causes some of the hot electrons obtaining high energy from the electric field to be implanted into the gate oxide film, wherein they remain to change the threshold voltage of the transistor little by little. This is the problem caused by hot carriers.

An N channel MOSFET having a lightly doped drain structure (LDD) has been devised to solve the above mentioned problem caused by hot electrons for improving the reliability of the N channel MOSFET.

Figure 1A:
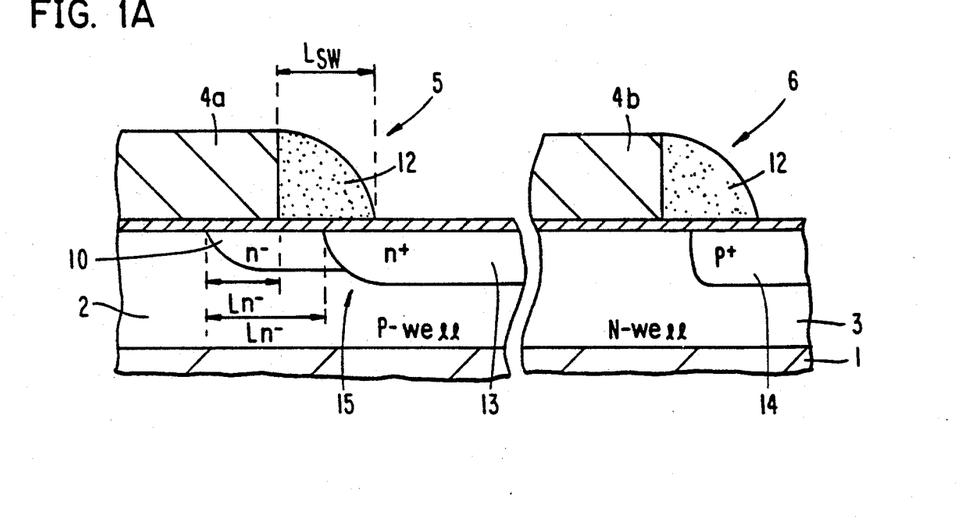
FIG. 1A is a partial sectional view of a complementary field effect transistor in accordance with one embodiment of the present invention.
Figure 1B:
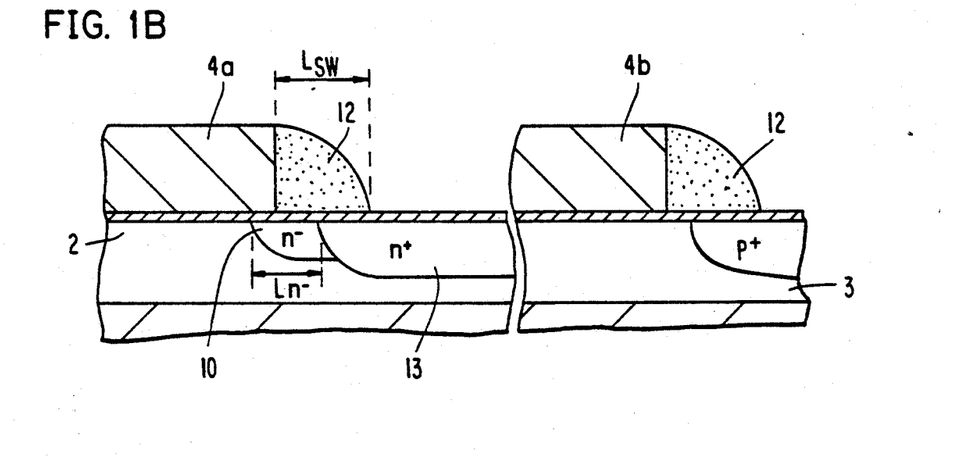
FIG. 1B is a sectional view of a conventional CMOS device comprising an N channel MOSFET having an LDD structure.

FIG. 1B is a sectional view of a conventional CMOSFET comprising an N channel MOSFET having a LDD structure. FIGS. 5A-5F are sectional views of the manufacturing steps of the CMOSFET shown in FIG. 1B. Referring to these figures, a method of manufacturing a conventional CMOSFET comprising an N channel MOSFET having an LDD structure will be described.

Figure 5A:
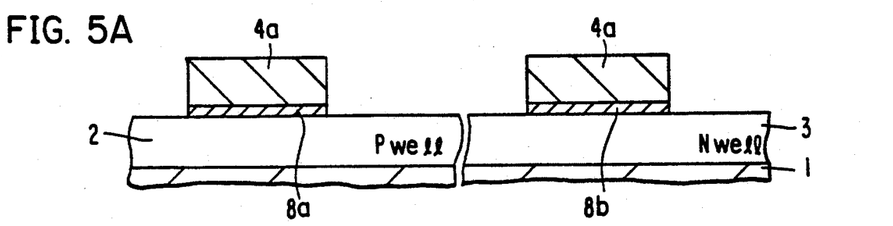
FIGS. 5A-5F are sectional views of the manufacturing steps of a conventional complementary field effect transistor comprising an N channel MOSFET having an LDD structure.

Referring to FIG. 5A, a P well 2 and an N well 3 are formed on semiconductor substrate 1. A gate oxide film 8a is formed on the surface of P well 2. Gate electrode 4a comprising N type impurities is formed on gate oxide film 8a. Similarly, a gate oxide film 8b is formed on the surface of N well 3, and gate electrode 4b comprising N type impurities is formed on gate oxide film 8b. Gate oxide films 8a and 8b are formed at the same time. Also, gate electrodes 4a and 4b are formed at the same time. The purpose of implanting N type impurities into gate electrode 4a, 4b is to raise the conductivity of the gate electrode.

Figure 5B:
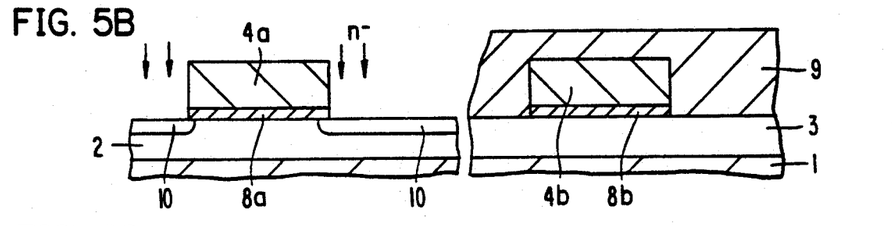

Referring to FIG. 5B, the N well 3 side is covered by a resist 9. Using gate electrode 4a as the mask, N type impurity ions of relatively low concentration are implanted into the main surface of P well 2. As a result, N type impurity region 10 of relatively low concentration is formed in the main surface of P well 2 at both sides of gate electrode 4a. Then, resist 9 is removed.

Figure 5C:
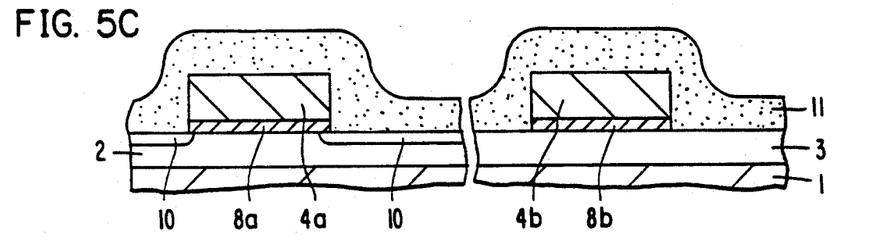

Referring to FIG. 5C, an oxide film 11 is deposited over semiconductor substrate 1 so as to cover gate electrodes 4a and 4b.

Figure 5D:
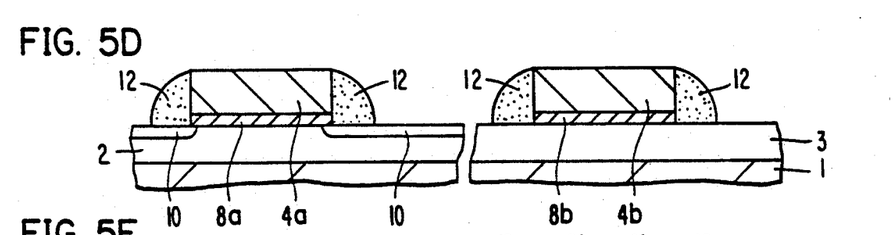

Referring to FIGS. 5C and 5D, oxide film 11 is etched back by anisotropic etching to form sidewall spacers 12 on the sidewalls of gate electrodes 4a, 4b.

Figure 5E:
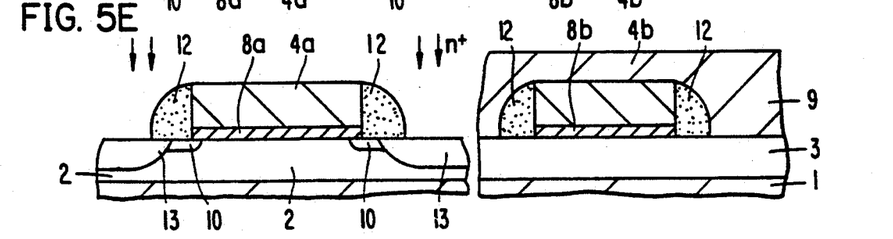

Referring to FIG. 5E, the N well 3 side is covered by resist 9. N type impurity ions of relatively high concentration are implanted into the main surface of P well 2. As a result, an impurity region 13 having a concentration higher than that of impurity region 10 is formed which joins impurity region 10 of low concentration in the main surface of P well 2. The concentration of impurity region 10 is generally set to be approximately 1/100 of the concentration of impurity region 13 to form LDD structure. Next, resist 9 is removed.

Figure 5F:
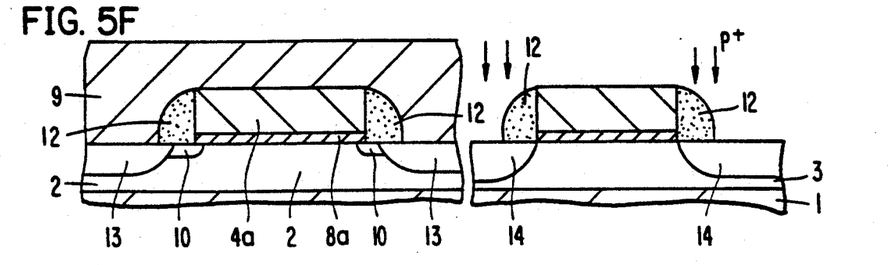

Referring to FIG. 5F, the P well 2 side is covered by resist 9. Using gate electrode 4b and sidewall spacers 12 as the mask, P type impurity ions are implanted into the main surface of N well 3. As a result, a P type impurity region 14 is formed in the main surface of N well 3 at both sides of gate electrode 4b. Because the diffusion rate of P type impurities is high, the impurities diffuse as far as to the edge of gate electrode 4b. In the above described manner, a CMOSFET comprising an N channel MOSFET of the LDD structure shown in FIG. 1B is formed.

The problems of the CMOSFET comprising an N channel MOSFET of the LDD structure shown in FIG. 1B will be explained hereinafter.

Referring to FIG. 1B, the width of sidewall spacer 12 is $L_{SW}$, while the width of impurity region 10 of low concentration is $L_n-$. $L_n-$ must be not less than 0.2 $\mu$m to reduce the electric field in the vicinity of the drain which generates hot carriers. However, impurity region 10 of low concentration cannot easily extend beneath gate electrode 4a because it is formed by implanting ions perpendicularly, as shown in FIG. 5B. In order to obtain $L_n-$ of not less than 0.2 $\mu$m, impurity region 13 of high concentration must be formed at a position far away from gate electrode 4a. Accordingly, it is necessary to have a considerably wide $L_{SW}$. A typical value of $L_{SW}$ is 0.3 $\mu$m.

Such an LDDMOSFET has the following two serious problems. The first problem is that impurity region 10 of low concentration located below sidewall spacer 12 changes to substantially high concentration by the gate electric field only in the region as far as to approximately 0.05 $\mu$m from the edge of gate electrode 4a. The major part of impurity region 10 of low concentration beneath sidewall spacer 12 remains as a high resistance layer even at the time of applying gate voltage. As a result, current handling capability and high speed are decreased.

Figure 6:
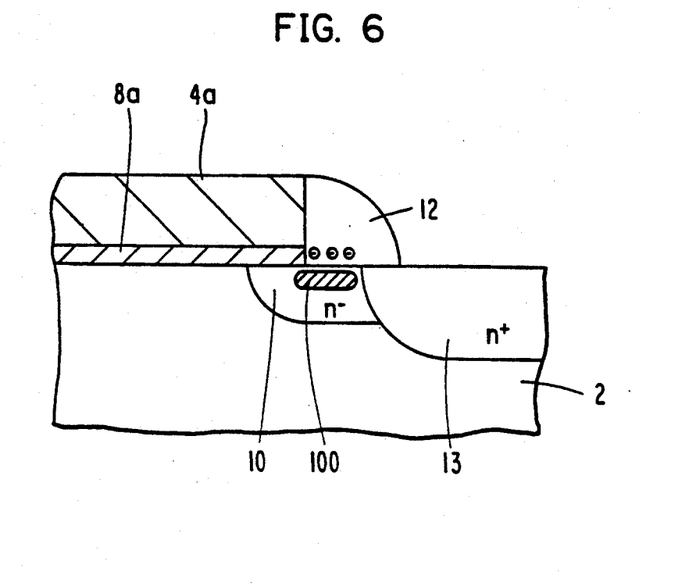
FIG. 6 is a sectional view for explaining the problems of the conventional N channel MOSFET having an LDD structure.

The second problem is that hot electrons generated by the electric field are implanted into sidewall spacer 12, due to the fact that the maximum point of the electric field in the drain exists beneath sidewall spacer 12, as shown in FIG. 2B(2). This causes the low concentration of impurity region 10 to become increasingly lower. As a result, impurity region 10 becomes a layer of further high resistance. Referring to FIG. 6, the portion denoted with reference number 100 is the region where concentration is lowered. The current handling capability is degraded, whereby the high speed is lowered. In the right graph of FIG. 2B(2) the abscissa x represents the distance from the edge of gate electrode 4a, while the ordinate $E_{ch}$ represents the strength of the electric field along the direction of channel length. The same can be said in FIGS. 2A(2) and 2C(2).

LDDMOSFET comprises the above described problems. A Gate/N− overlapped LDDMOSFET has been proposed to solve these problems.

Figure 1C:
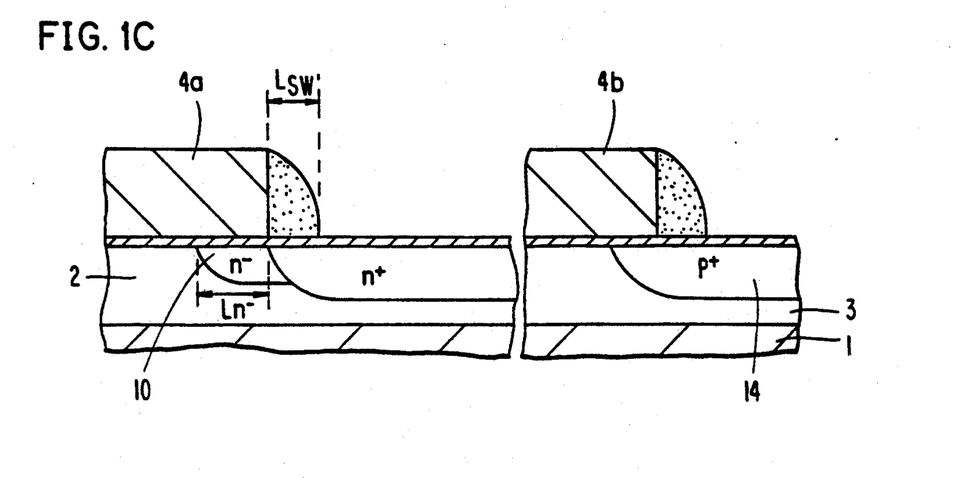
FIG. 1C is a partial sectional view of a CMOS device comprising Gate/N⁻ overlapped LDDMOSFET.

Referring to FIG. 1C, the feature of Gate/N− overlapped LDDMOSFET lies in the point that impurity region 10 of low concentration extends widely beneath gate electrode 4a. It is obvious that the problem of the LDDMOSFET shown in FIG. 1B arises from the fact that impurity region 10 of low concentration exists beneath sidewall spacer 12.

FIGS. 7A–7F are sectional views of the manufacturing steps of a CMOSFET comprising Gate/N− overlapped LDDMOSFET shown in FIG. 1C. The method of manufacturing this CMOSFET is described hereinafter.

Figure 7A:
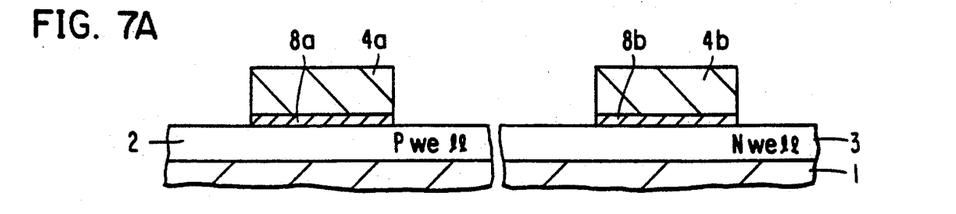
FIGS. 7A-7F are sectional views of the manufacturing steps of a conventional complementary field effect transistor comprising Gate/N⁻ overlapped LDDMOSFET.

Referring to FIG. 7A, P well 2 and N well 3 are formed on semiconductor substrate 1 Gate oxide film 8a is formed on the surface of P well 2. Gate electrode 4a comprising N type impurities is formed on gate oxide film 8a. Similarly, gate oxide film 8b is formed on the surface of N well 3, and gate electrode 4b comprising N type impurities is formed on gate oxide film 8b. Gate oxide films 8a and 8b are formed a the same time. Also, gate electrodes 4a and 4b are formed at the same time.

Figure 7B:
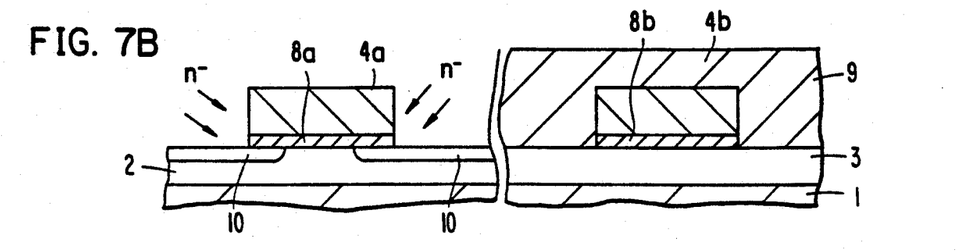

Referring to FIG. 7B, the N well 3 side is covered by resist 9. Next, using gate electrode 4a as a mask, N type impurity ions of relatively low concentration are implanted into the main surface of P well 2 from a direction oblique to the main surface. Impurity region 10 of relatively low concentration is formed extending below gate electrode 4a in the main surface of P well 2 at both sides of gate electrode 4a. Then, resist 9 is removed.

Figure 7C:
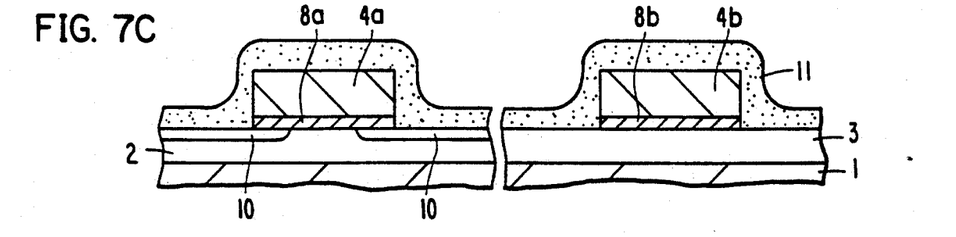

Referring to FIG. 7C, oxide film 11 is deposited over semiconductor substrate 1 so as to cover gate electrodes 4a and 4b.

Figure 7D:
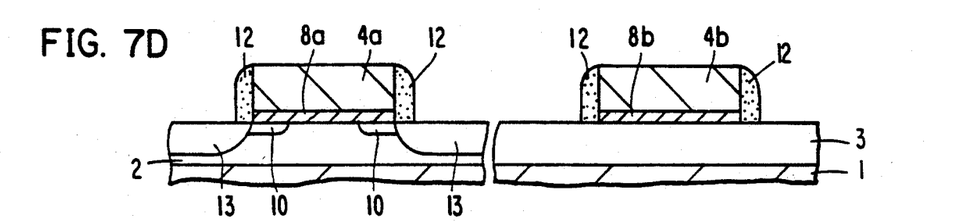

Referring to FIGS. 7C and 7D, oxide film 11 is etched back by anisotropic etching to form sidewall spacers 12 at the sidewalls of gate electrodes 4a, 4b. The thickness of oxide film 11 is adjusted so that the width of sidewall spacer 12 becomes 0.15 μm.

Figure 7E:
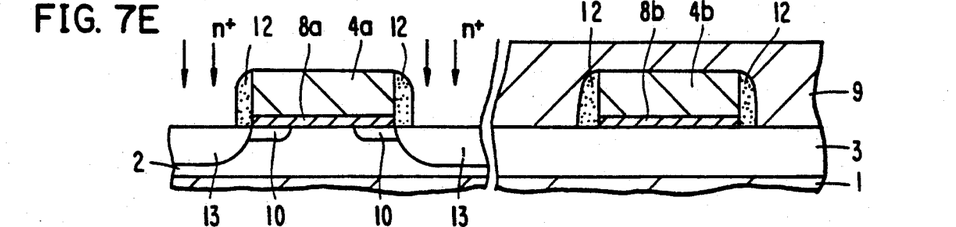

Referring to FIG. 7E, the N well 3 side is covered by resist 9. By implanting N type impurity ions of relatively high concentration into the main surface of P well 2, impurity region 13 having a concentration higher than that of impurity region 10 is formed in the main surface of P well 2 which joins impurity region 10. The concentration of impurity region 10 is set to be a concentration of 1/100 of the concentration of impurity region 13.

Figure 7F:
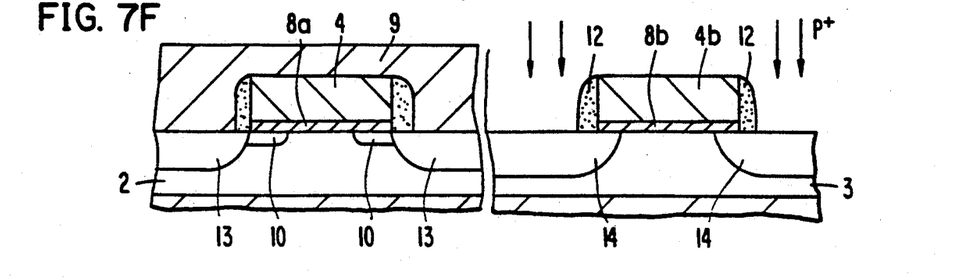

Referring to FIG. 7F, the P well 2 side is covered by resist 9. Using sidewall spacers 12 formed on the sidewalls of gate electrodes 4a and 4b, P type impurity ions are implanted into the main surface of N well 3. As a result, P type impurity region 14 is formed in the main surface of N well 3 at both sides of gate electrode 4b. Then, resist 9 is removed.

Figure 8:
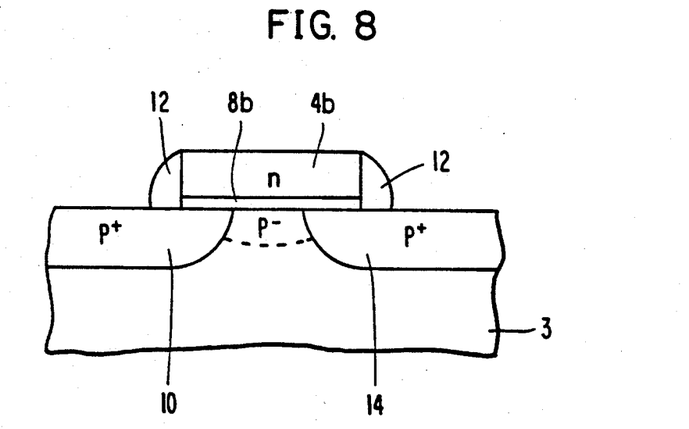
FIG. 8 is a view for explaining the problem of a P channel MOSFET of a conventional complementary field effect transistor comprising Gate/N⁻ overlapped LDDMOSFET.

In Gate/N− overlapped LDDMOSFET formed in the above manner, the maximum point of the electric field in the drain comes below gate electrode 4a, as shown in FIG. 2C(2). Accordingly, hot electrons are not implanted into sidewall spacer 12, even if hot electrons are generated. Therefore, the state shown in FIG. 6 is avoided, where impurity region 10 of low concentration turns to a high resistance layer in the region at a distance from gate electrode 4a. As a result, decrease in high speed and deterioration of reliability do not occur. However, as shown in FIG. 7F, P+ impurity region 14 expands deeply below gate electrode 4b because the width of sidewall spacer 12 along the direction identical to the direction of the channel length is small, when P+ impurity region is formed by implanting P type impurity ions into the main surface of N well 3. This results in the generation of punch-through in the buried channel P channel MOSFET, in reference to FIG. 8.

SUMMARY OF THE INVENTION

An object of the invention is to provide a semiconductor device having at least two field effect transistor, having reliability and high speed of an N channel MOSFET improved.

Another object of the invention is to provide a CMOSFET improved so as to have higher reliability and high speed in an N channel MOSFET, and without punch-through in a P channel MOSFET.

A further object of the invention is to provide a CMOSFET having both reliability and high speed in an N channel MOSFET, and without punch-through in a P channel MOSFET, even though the device becomes more minute.

A still further object of the invention is to provide a method of manufacturing a CMOSFET,, having both reliability and high speed in an N channel MOSFET, and without punch-through in a P channel MOSFET, even though the device becomes more minute.

A complementary field effect transistor in accordance with the present invention comprises a semiconductor, substrate having an N type main surface and an P type main surface. On the P type main surface of the semiconductor substrate, an N channel MOSFET is formed including a gate electrode and one pair of impurity regions which becomes a pair of source/drain regions. On the N type main surface of the semiconductor substrate, a P channel MOSFET is formed including a gate electrode and a pair of impurity regions which becomes a pair of source/drain regions. Each impurity region of the N channel MOSFET comprises an impurity region of relatively low concentration formed so as to extend beneath the gate electrode, and an impurity region having a concentration lower than that of the impurity region of low concentration formed at a location spaced apart from the above mentioned gate electrode joining the above mentioned impurity region of low concentration. The length of the portion beneath the above mentioned gate electrode in the main surface portion of the impurity region of low concentration along the direction identical to the direction of the channel length is not less than 0.1 μm.

The method in accordance with another aspect of the present invention is a method of manufacturing a complementary field effect transistor having an N channel MOSFET including a first gate electrode and a P channel MOSFET including a second gate electrode formed on one substrate. The first gate electrode and the second gate electrode are formed on the semiconductor substrate having a main surface. By implanting ions into the main surface of the semiconductor substrate from a direction oblique to the main surface using the first gate electrode as a mask, an impurity region of relatively low concentration is formed extending beneath the first gate electrode in the main surface of the semiconductor substrate at both sides of the first gate electrode. Sidewall spacers having a width of not less than 0.2 μm in the direction identical to the direction of the channel length is formed on both sidewalls of the first gate electrode and the second gate electrode. By implanting ions using the sidewall spacers formed on the sidewalls of the first gate electrode as a mask, an impurity region is formed having a concentration higher than that of the impurity region of low concentration which joins the impurity region of low concentration in the main surface of the semiconductor substrate at both sides of the first gate electrode. By implanting ions using the sidewall spacers formed on the sidewalls of the second gate electrode as a mask, a P type impurity region is formed on both sides of the second gate electrode.

In accordance with the complementary field effect transistor of the present invention, the maximum point of the electric field (Ech) of the drain end comes below the gate electrode, because the length of the portion located beneath the gate electrode in the main surface of the impurity region of low concentration is implemented to be not more than 0.1 μm in the direction along the channel length. Accordingly, hot electrons are not implanted into sidewall spacers even though hot electrons are generated. Therefore, the situation where the impurity region of low concentration becomes a high resistance layer in the region at a distance from the gate electrode does not occur. Consequently, decrease in high speed and deterioration in reliability do not occur.

The width of the sidewall spacer in the direction identical to the direction of the channel length is made to be wide so that the impurity region of high concentration is formed far from the gate electrode. If the width of the sidewall spacer at the P well side is broadened, the width of the sidewall spacer at the N well side also broadens, due to the fact that the sidewall spacer of P well side and the sidewall spacer of N well side are formed at the same time. Accordingly, P+ impurity region will not extend beneath the gate electrode in the P channel MOSFET. Therefore, the punch-through phenomenon does not occur in the P channel MOSFET.

In accordance with the method of manufacturing the inventive complementary field effect transistor regarding the formation of an N channel MOSFET, ions are implanted into the main surface of the semiconductor substrate from a direction oblique to the main surface to form the impurity region of low concentration at both sides of the gate electrode in the main surface of the semiconductor substrate beneath gate electrode. Therefore, the impurity region of low concentration can be formed so that the maximum point of the electric field (Ech) at the drain end comes beneath gate electrode. The impurity region of low concentration is prevented from becoming a high resistance layer in the region at a distance from the gate, even if hot electrons are generated. Accordingly, a complementary field effect transistor can be manufactured without deterioration in high speed and reliability.

There are sidewall spacers having a width not less than 0.2 μm in the direction identical to the direction of the channel length at the sidewalls of the gate electrodes. P type impurity ions are implanted into the main surface of the N well using sidewall spacers as a mask so the P type impurity region will not extend below the gate electrode. As a result, a complementary field effect transistor is obtained without the punch-through phenomenon in a P channel MOSFET.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2A(1) and 2A(2) are diagrams for explaining the effect of a N channel MOSFET in accordance with one embodiment of the present invention.

FIGS. 2B(1) and 2B(2) are diagrams for explaining the performance of a conventional N channel MOSFET having an LDD structure.

FIGS. 2C(1) and 2C(2) are diagrams for explaining the performance of a conventional Gate/N⁻ overlapped LDDMOSFET.

DESCRIPTION OF THE PREFERRED EMBODIMENTS

FIG. 1A is a partial sectional view of a complementary field effect transistor in accordance with one embodiment of the present invention. Referring to FIG. 1A, P well 2 and N well 3 are formed on semiconductor substrate 1. In P well 2, N channel MOSFET 5 is formed comprising gate electrode 4a and a pair of impurity region 15 which becomes a pair of source/drain region. In N well 3, P channel MOSFET 6 is formed comprising gate electrode 4b and a pair of impurity region 14 which becomes a pair of source/drain region. Each impurity region 15 of N channel MOSFET 5 comprises N type impurity region 10 of relatively low concentration formed so as to extend beneath gate electrode 4a, and impurity region 13 having a concentration higher than that of impurity region 10 of low concentration formed in a region at a distance from gate electrode 4a joining impurity region 10. The length ($L_n-$) of the portion beneath gate electrode 4a in the surface portion of impurity region 10 of low concentration in the direction identical to the direction of the channel length is not less than 0.1 μm, preferably 0.1–0.3 μm. The length ($L_n-$,) of the surface portion of impurity region 10 of low concentration in the direction identical to the direction of the channel length is preferably not more than 0.3 μm.

The sidewalls of gate electrode 4a of N channel MOSFET 5 and gate electrode 4b of P channel MOSFET 6 are provided with sidewall spacers 12. The width (LSW) of sidewall spacer 12 in a direction identical to the direction of the channel length is selected to be within the range of 0.2–0.3 μm.

Figure 2A:
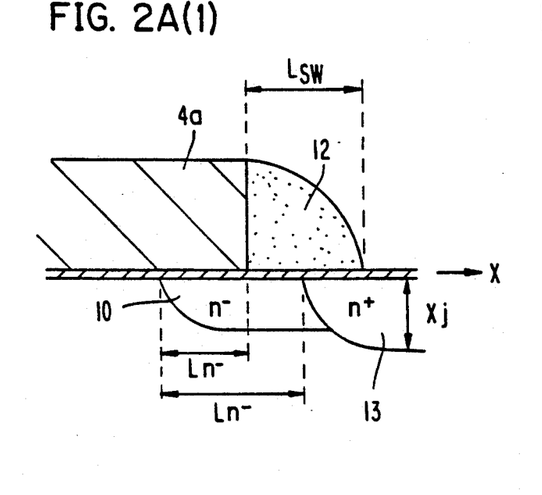
Figure 2B:
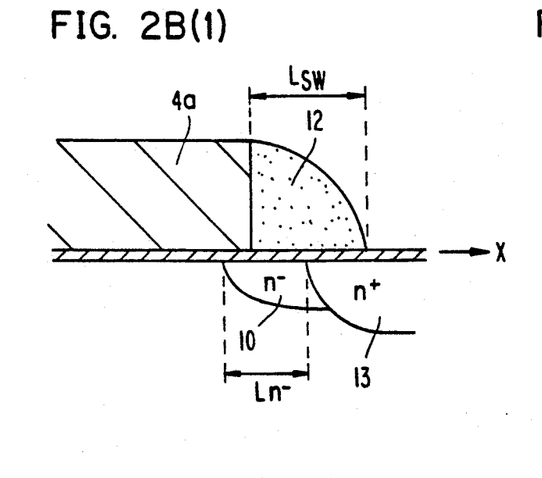
Figure 2C:
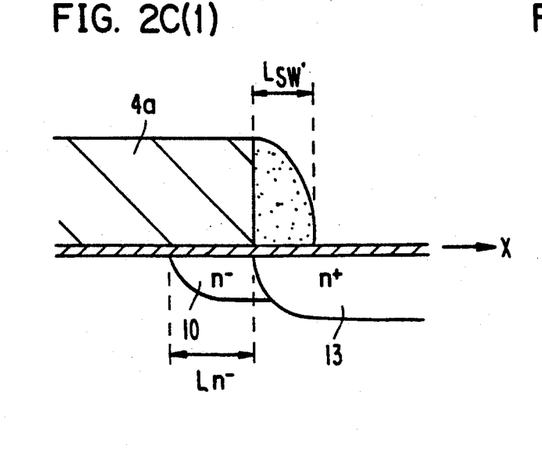

In accordance with the complementary field effect transistor of the embodiment, the maximum point of the electric field (Ech) at the drain end comes below gate electrode 4a, in reference to the right graph of FIG. 2A, because the length of the portion located beneath gate electrode 4a in the surface portion of impurity region 10 of low concentration is in the range of 0.1 μm–0.3 μm. Therefore, hot electrons are not implanted into sidewall spacers 12 even if hot electrons are generated. Accordingly, the state shown in FIG. 6 where impurity region 10 of low concentration becomes a high resistance layer in a region at a distance from gate electrode 4a does not occur. As a result, reduction in high speed and deterioration in reliability will not occur.

Referring to FIG. 1A, the width of sidewall spacer 12 in the direction of the channel length is 0.2–0.3 μm, so that the impurity region of high concentration is formed at a location spaced apart from gate electrode 4a. If the width of the sidewall spacer of the P well 2 side is 0.2–0.3 μm, the width of sidewall spacer 12 of the N well 3 side also becomes 0.2–0.3 μm, in reference to FIGS. 3C and 3D, because sidewall spacer 12 of the P well 2 side and sidewall spacer 12 of the N well 3 side are formed at the same time. Accordingly, P+ impurity region 14 does not extend below gate electrode 4b at the time of P+ impurity region 14 formation. As a result, the punch-through phenomenon shown in FIG. 8 does not occur in the P channel MOSFET.

The method of manufacturing the complementary field effect transistor of FIG. 1A is described hereinafter.

FIG. 3A–3E are sectional views of a complementary transistor field effect transistor at different manufacturing steps in accordance with one embodiment of the present invention.

Figure 3A:
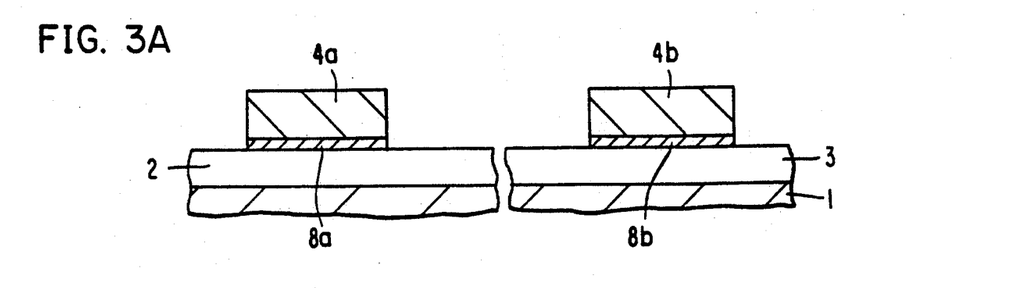
FIGS. 3A-3E are sectional views of the manufacturing steps of a complementary field effect transistor in accordance with one embodiment of the present invention.

Referring to FIG. 3A, P well 2 and N well 3 are formed on semiconductor substrate 1. Gate oxide film 8a is formed on the surface of P well 2. Gate electrode 4a including N type impurities is formed on gate oxide film 8a. Similarly, gate oxide film 8b is formed on the surface of N well 3, and gate electrode 4b including N type impurities is formed on gate oxide film 8b. Gate oxide films 8a and 8b are formed at the same time. Also, gate electrodes 4a and 4b are formed at the same time.

Figure 3B:
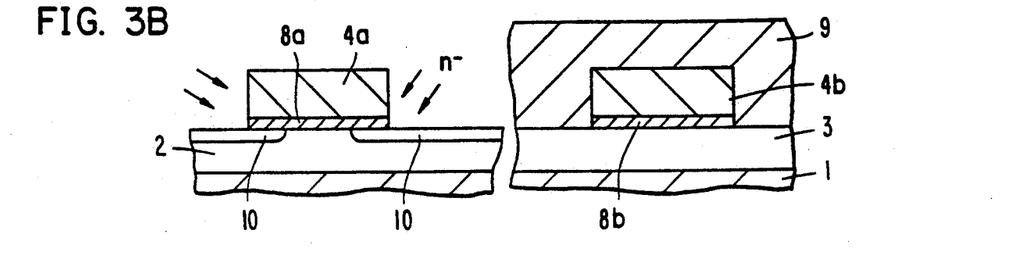

Referring to FIG. 3B, N well 3 side is covered by resist 9. N type impurity ions of relatively low concentration are implanted into the main surface of P well 2 from a direction oblique to the main surface using gate electrode 4a as a mask. Consequently, impurity region 10 of relatively low concentration is formed extending below gate electrode 4a in the main surface of P well 2 at both sides of gate electrode 4a. The step of ion implantation from a direction oblique to the main surface comprises the steps of forming a beam of N type impurity ions, arranging the semiconductor substrate 1 so that it will not be at right angles with respect to the beam, and rotating the semiconductor substrate 1.

Figure 3C:
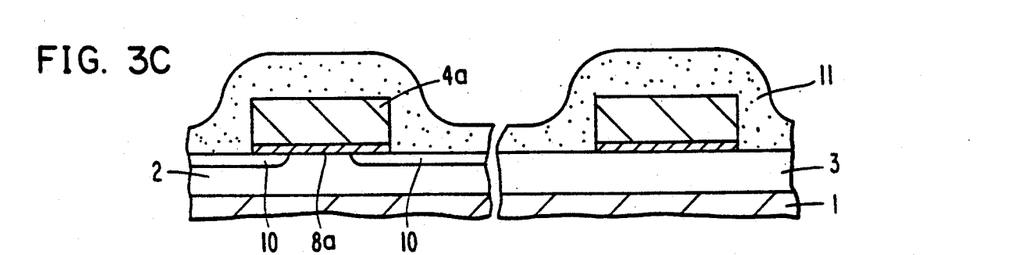

Referring to FIG. 3C, oxide film 11 is deposited over semiconductor substrate 1 so as to cover gate electrodes 4a and 4b.

Figure 3D:
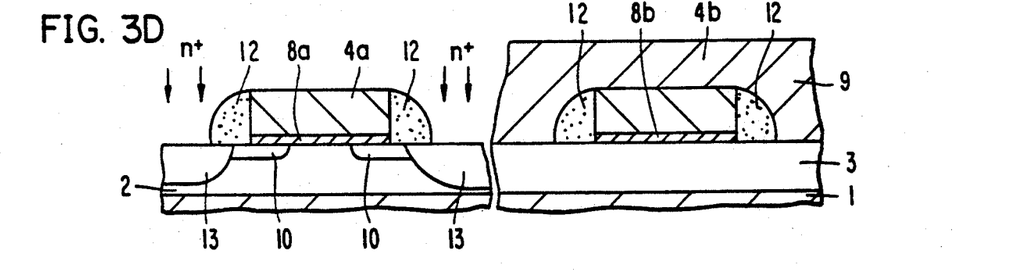

Referring to FIGS. 3C and 3D, oxide film 1 is etched back by anisotropic etching to form sidewall spacers 12 at the sidewalls of gate electrodes 4a, 4b. Oxide film 11 of the required film thickness is deposited so that the width of sidewall spacer 12 in the direction identical to the direction of the channel length is within the range of 0.2–0.3 μm. Then, the N well 3 side is covered by resist 9. By implanting N type impurity ions of relatively high concentration into the main surface of P well 2 using gate electrode 4a and sidewall spacers 12 as masks, impurity region 13 having a concentration higher than that of impurity region 10 is formed in the main surface of P well joining impurity region 10 of low concentration. The concentration of impurity region 10 of low concentration is set to a concentration of about 1/100 of that of impurity region 13 of high concentration for obtaining a LDD structure. Then, resist 9 is removed.

Figure 3E:
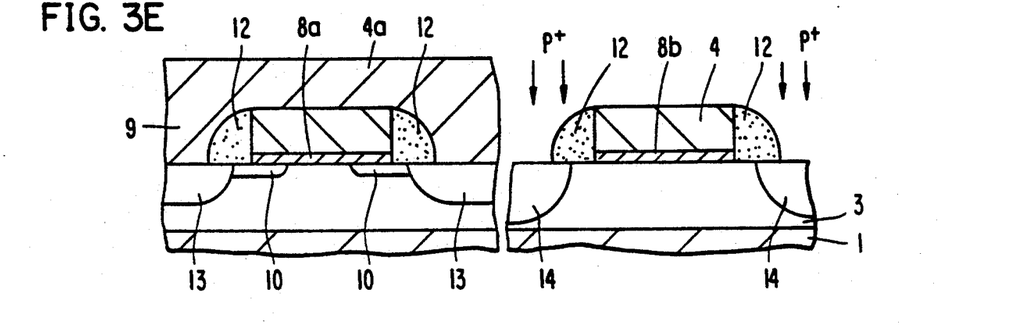

Referring to FIG. 3E, P type impurity ions are implanted into the main surface of N well 3 using gate electrode 4b and sidewall spacers 12 as a mask to form P type impurity region 14 in the main surface of N well 3 at both sides of gate electrode 4b. Because the widths of sidewall spacer 12 in the direction identical to the direction of channel length is 0.2–0.3 μm, P type impurity region 14 does not extend below gate electrode 4b.

By removing resist 9, the complementary field effect transistor shown in FIG. 1A is obtained.

In accordance with the manufacturing method of the embodiment regarding the N channel MOSFET formation, ions are implanted into the main surface of P well 2 from a direction oblique to the main surface using gate electrodes 4a as a mask to form impurity region 10 of low concentration extending below gate electrode 4a in the main surface of P well 2 at both sides of gate electrode 4a. Referring to the right graph of FIG. 2A, impurity region 10 of low concentration can be formed so that the maximum point of the electric field (Ech) of the drain end comes beneath gate electrode 4a. This prevents impurity region 10 of low concentration from becoming a high resistance layer in the region spaced apart from gate electrode 4a even when hot electrons are generated. Therefore, a complementary field effect transistor without reduction in high speed and without deterioration in reliability can be obtained.

Referring to FIGS. 3D and 3E, sidewall spacers 12 having a width of not less than 0.2 μm in the direction identical to the direction of the channel length are formed on the sidewalls of gate electrodes 4a, 4b, followed by implanting P+ impurity ions into the main surface of N well 3, using these sidewall spacers as masks. This will prevent P+ impurity region 14 from extending to beneath gate electrode 4b. Consequently, the punch-through phenomenon shown in FIG. 8 will not occur in the P channel MOSFET.

The present invention comprises a complementary field effect transistor with the N channel MOSFET and the P channel MOSFET formed on the same substrate, and the method of manufacturing the same. This complementary field effect transistor has both reliability and high speed in the N channel MOSFET, and without punch-through in the P channel MOSFET, even though the device becomes more minute. This gives the advantage that the scale of integration of CMOS devices can be increased.

Although the CMOSFET was illustrated in the above embodiment, it may be other semiconductor device having at least two field effect transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A complementary field effect transistor with an N channel MOSFET and a P channel MOSFET formed on the same substrate, comprising:
    a semiconductor substrate having an N type main surface and a P type main surface,
    an N channel MOSFET including a gate electrode and a pair of impurity regions which becomes a pair of source/drain regions, formed on the P type main surface of said semiconductor substrate,
    a P channel MOSFET including a gate electrode and a pair of impurity regions which becomes a pair of source/drain regions, formed on the N type main surface of said semiconductor substrate,
    each impurity region of said N channel MOSFET comprising an impurity region of relatively low concentration formed so as to extend beneath said gate electrode, and an impurity region having a concentration higher than that of said impurity region of low concentration formed at a distance from said gate electrode and joining said impurity region of low concentration,
    the length of the portion located beneath said gate electrode in the surface portion of said impurity region of low concentration being not less than 0.1 μm in the direction identical to the direction of the channel length to position a maximum electric field of said impurity region of low concentration beneath said gate electrode, and
    wherein said impurity region of said P channel MOSFET does not extend beneath said gate electrode of said P channel MOSFET.

2. The complementary field effect transistor according to claim 1, wherein the length of the portion located beneath said gate electrode in the surface portion of said impurity region of low concentration is within the range of 0.1–0.3 μm in the direction identical to the direction of the channel length.

3. The complementary field effect transistor according to claim 1, wherein the length of the surface portion of said impurity region of low concentration is not more than 0.3 μm in the direction identical to the direction of the channel length.

4. The complementary field effect transistor according to claim 1, wherein the gate electrode of said N channel MOSFET and the gate electrode of said P channel MOSFET each are of the N type.

5. The complementary field effect transistor according to claim 1, wherein
    each of the sidewalls of the gate electrode of said N channel MOSFET and the gate electrode of said P channel MOSFET is provided with a sidewall spacer,
    the width of said sidewall spacer in the direction identical to the direction of the channel length is within the range of 0.2–0.3 μm.

6. A semiconductor device having at least two field effect transistors, comprising:
    a semiconductor substrate with N and P type regions having, respectively, first and second main surface portions;
    an N MOSFET on said second main surface portion of said substrate and formed of a pair of source/drain impurity regions spaced apart from each other in a channel direction on opposite sides of a first gate electrode;
    a P channel MOSFET on said first main surface portion of said substrate and formed of a pair of source/drain impurity regions spaced apart from each other in a channel direction on opposite sides of a second gate electrode;
    wherein sidewalls of insulating material are formed on opposite sides of each of said first and second gate electrodes,
    each impurity region of said N channel MOSFET comprising a region of a first concentration and a region of a second concentration higher than said first concentration, said regions of first and second concentrations intersecting each other beneath said sidewalls, the length of a portion of said region of first concentration beneath said first gate electrode along the second main surface portion in the channel direction being of a value to position a maximum electric field of said first concentration region beneath said first gate electrode; and
    wherein each said impurity region of said P channel MOSFET is positioned along the first main surface portion of said substrate to extend beneath a sidewall of, but in non-overlapping relationship with, said second gate electrode.

7. A method of manufacturing a complementary field effect transistor with an N channel MOSFET including a first gate electrode and a P channel MOSFET including a second gate electrode formed on the same substrate, comprising the steps of:
    forming the first gate electrode and the second gate electrode on the semiconductor substrate having a main surface,
    implanting ions into the main surface of said semiconductor substrate in a direction oblique to said main surface using said first gate electrode as a mask to form an impurity region of relatively low concentration extending beneath said first gate electrode in the main surface of said semiconductor substrate at both sides of said first gate electrode, forming sidewall spacers having a width of not less than 0.2 μm in the direction identical to the direction of the channel length at both sidewalls of said first gate electrode and said second gate electrode, vertically implanting ions using said sidewall spacers formed at both sidewalls of said first gate electrode as the mask, to form an impurity region having a concentration higher than that of said impurity region of low concentration in the main surface of said semiconductor substrate at both sides of said first gate electrode joining said impurity region of low concentration, and vertically implanting ions using said sidewall spacers formed at both sidewalls of said second gate electrode as the mask, to form a P type impurity region in the main surface of said semiconductor substrate at both sides of said second gate electrode in non-overlapping relationship with said second gate electrode.

8. The method according to claim 7, wherein the step of implanting ions into the main surface of said semiconductor substrate from a direction oblique to said main surface comprises the steps of forming a beam of said ions, arranging said semiconductor substrate so that it will not be at right angles to said beam, and rotating said semiconductor substrate.

9. The method according to claim 7, wherein the step of forming sidewall spacers at both sidewalls of said first gate electrodes and said second gate electrode comprises the steps of depositing an oxide film having a predetermined thickness over the entire surface of said semiconductor substrate including said first gate electrode and said second gate electrode, and etching said oxide film anisotropically so that said oxide film remains at both sidewalls of said first gate electrode and said second gate electrode.

* * * * *